(12) United States Patent
Roohparvar (10) Patent No.: US 7,028,282 B2
(45) Date of Patent: Apr. 11, 2006

(54) INTEGRATED CIRCUIT WITH LAYOUT MATCHED HIGH SPEED LINES

(75) Inventor: Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 10/368,992

(22) Filed: Feb. 19, 2003

(65) Prior Publication Data

US 2003/0126573 A1 Jul. 3, 2003

Related U.S. Application Data

(62) Division of application No. 09/905,055, filed on Jul. 12, 2001, now Pat. No. 6,571,380.

(51) Int. Cl.
*G06F 17/50* (2006.01)
*H03K 19/00* (2006.01)

(52) U.S. Cl. .............. 716/17; 716/12; 716/13; 716/14; 326/41; 326/47; 326/101; 326/102; 326/564; 326/565; 326/566

(58) Field of Classification Search .......... 716/1, 716/5, 6, 10, 12, 13, 16; 713/503; 703/17
See application file for complete search history.

(56) References Cited

U.S. PATENT DOCUMENTS

| | | | |
|---|---|---|---|
| 4,831,497 A | 5/1989 | Webster | |
| 5,663,908 A | 9/1997 | Roohparvar | |
| 5,761,130 A | 6/1998 | Roohparvar | |
| 5,761,131 A | 6/1998 | Roohparvar | |
| 5,774,401 A | 6/1998 | Roohparvar | |
| 5,936,877 A | 8/1999 | Morgan | |
| 5,995,402 A | 11/1999 | Morgan | |
| 6,144,575 A | 11/2000 | Morgan | |
| 6,205,058 B1 | 3/2001 | Roohparvar | |
| 6,301,141 B1 | 10/2001 | Morgan | |
| 6,301,142 B1 | 10/2001 | Morgan | |
| 6,314,012 B1 | 11/2001 | Morgan | |
| 6,320,779 B1 | 11/2001 | Morgan | |
| 6,327,167 B1 | 12/2001 | Morgan | |
| 6,526,553 B1 * | 2/2003 | Andreev et al. ............ 716/8 |
| 6,564,362 B1 * | 5/2003 | Osaki et al. ............... 716/10 |
| 6,588,005 B1 * | 7/2003 | Kobayashi et al. .......... 716/12 |

* cited by examiner

*Primary Examiner*—A. M. Thompson
*Assistant Examiner*—Helen Rossoshek
(74) *Attorney, Agent, or Firm*—Leffert Jay & Polglaze PA (57) ABSTRACT

A set of high speed interconnect lines for an integrated circuit has an improved line-to-line capacitance and overall RC time constant. The high speed interconnect line set incorporates a series of interconnect lines, wherein shorter run lines are routed between longer run lines. As the short run interconnect lines reach their destination and fall away they open up the line spacing and improve the line-to-line capacitance that dominates capacitive effects in modern reduced feature size integrated circuits. Additionally, the cross sectional area of the interconnect lines can be increased to lower the line resistance of longer run lines and compensate for the line capacitance without increasing the line-to-line capacitance. The capacitances, resistances, and RC time constants can be optimized for a single line of a group or for the entire group of interconnect lines, providing a low average value or a uniform value across all lines for uniform propagation delay.

44 Claims, 3 Drawing Sheets

INTEGRATED CIRCUIT WITH LAYOUT MATCHED HIGH SPEED LINES

RELATED APPLICATION

This is a divisional application of U.S. patent application Ser. No. 09/905,055, filed Jul. 12, 2001, now U.S. Pat. No. 6,571,380, issued May 27, 2003, titled "INTEGRATED CIRCUIT WITH LAYOUT MATCHED HIGH SPEED LINES" and commonly assigned, the entire contents of which are incorporated herein by reference.

TECHNICAL FIELD OF THE INVENTION

The invention relates to integrated circuits, and more particularly, to circuits with high speed interconnect lines.

BACKGROUND OF THE INVENTION

As the operating frequencies on modem integrated circuits have become increasingly higher, signal propagation timing constraints have become increasingly stricter. This is particularly the case for synchronous integrated circuits, where signals are expected at interfaces and inputs at specific times. A major source of signal propagation delay in modern integrated circuits is delay from resistive and capacitive loading. This potential for signal propagation delay due to RC loading has become even more of a predominant issue with the decreasing device sizes, spacing, and operating voltages of modern components.

The primary object of most common types of modern integrated circuit construction techniques is to increase operating speed and frequencies of integrated circuit device components by reducing device component sizes and operating voltages. While accomplishing this goal, however, the reduced device sizes decrease interconnect line cross section area, which has the effect of-increasing the individual line resistances. The same reduction in feature size reduces the line-to-line spacing, increasing the interconnect line capacitance due to line-to-line capacitance effects. Both these effects adversely influence the RC loading of the interconnect lines in integrated circuits. This increased RC loading interferes with signal propagation speed and increase the likelihood of timing faults when the circuit is in operation.

Line resistance and line-to-line capacitance is particularly an issue in high speed lines that have longer run lengths or drive external buffers. Relatively long run lines typically have high RC time constants because of increased individual line resistance and capacitance, due to line length, line-to-line spacing, and bulk silicon effects. The increased line capacitance and resistance of such long run lines typically require the use of increased line voltage to counteract the increased RC time constant they engender and increase timing constraints.

For the reasons stated above, and for other reasons stated below which will become apparent to those skilled in the art upon reading and understanding the present specification, there is a need in the art for a system to reduce line-to-line capacitive effects and increased RC time constants in integrated circuits with reduced feature size. Additionally, there is a need for the ability to reduce interconnect line capacitance, and to have matched delays and RC time constants across grouped long run lines.

SUMMARY OF THE INVENTION

The above-mentioned problems with integrated circuit interconnect resistive and capacitive loading, and other problems, are addressed by the present invention and will be understood by reading and studying the following specification.

In one embodiment, an integrated circuit comprises a set of interconnect lines of differing lengths implemented in close physical proximity, and running generally in parallel to each other, wherein the set of interconnect lines comprise, a subset of interconnect lines with a longer parallel run length than average for the set, and a subset of interconnect lines with a shorter parallel run length than average for the set, wherein each member of the subset of shorter run length interconnect lines is routed in between two members of the subset of longer run length interconnect lines, such that a space in between two members of the subset of longer run length interconnect lines left open when the short run line reaches the end of its parallel run length.

In another embodiment, an integrated circuit comprises an active circuit, a set of distributed circuits, and a set of conductors of differing lengths implemented in close physical proximity and running generally in parallel to each other, wherein each member of the set of distributed circuits is coupled to at least one member of the set of distributed circuits, and wherein the set of conductors comprises, a subset of generally longer than average conductors, and a subset of generally shorter than average conductors, such that in a plan view each member of the subset of shorter conductors is routed beside a member of the subset of longer conductors wherein a space occupied by the shorter conductor is not filled by another conductor or component when the shorter conductor reaches the end of its generally parallel run length, providing increased lateral separation.

In a further embodiment, a memory device comprises an address interface coupled to a first I/O buffer circuit, a first interconnect circuit coupled to the first I/O buffer circuit and to an address register, a data interface coupled to a second I/O buffer circuit, a second interconnect circuit coupled to the second I/O buffer circuit, a control interface coupled to a third I/O buffer circuit, and a third interconnect circuit coupled to the third I/O buffer circuit, wherein the first, second and third interconnect circuits each comprise a set of interconnect lines of differing lengths, implemented in close physical proximity, and running generally in parallel to each other, a subset of generally longer than average interconnect lines, and a subset of generally shorter than average interconnect lines, such that, in a plan view, each member of the subset of shorter interconnect lines is routed beside a member of the subset of longer interconnect lines such that a space occupied by the shorter interconnect line is not filled by another interconnect line or component when the shorter interconnect line reaches the end of its generally parallel run length, providing increased lateral separation.

In yet another embodiment, an integrated circuit comprises an active circuit, a set of distributed circuits, and a set of conductors of differing lengths implemented in close physical proximity and running generally in parallel to each other, and each conductor having a line resistance, $R_L$, a first capacitance, $C_B$, due to a bulk substrate capacitance, and a second capacitance, $C_L$, due to conductor to conductor capacitance effects, such that each conductor has a RC time constant of $R_L (C_B+C_L)$, and wherein each member of the set of conductors is coupled to the active circuit and to at least one member of the set of distributed circuits, such that the set of conductors comprises a subset of generally longer than average conductors, and a subset of generally shorter than average conductors, wherein an average RC time constant of the set of conductors is reduced by routing each member of the subset of shorter conductors beside a member of the subset of longer conductors, such that a space occupied by the shorter conductor is not filled by another conductor or component when the shorter conductor reaches the end of its generally parallel run length to reducing the second capacitance, $C_L$, due to conductor to conductor capacitance effects.

A method of adjusting an integrated circuit for a reduced conductor capacitance comprises routing a first subset of generally longer conductors of a set of generally parallel and physically proximate conductors, and selectively routing a second subset of generally shorter conductors of the set of generally parallel and physically proximate conductors to reduce conductor to conductor capacitance, such that in a plan view each member of the second subset of generally shorter conductors is routed beside a member of the first subset of longer conductors such that a space occupied by the shorter conductor is not filled by another conductor or component when the shorter conductor reaches the end of its generally parallel run length, providing increased lateral separation.

Another method of adjusting an integrated circuit for a reduced interconnect line RC time constant comprises routing a first subset of generally longer interconnect lines of a set of generally parallel and physically proximate interconnect lines, selectively routing a second subset of generally shorter interconnect lines of the set of generally parallel and physically proximate interconnect lines to reduce interconnect line to interconnect line capacitance, wherein each member of the second subset of generally shorter interconnect lines is routed beside a member of the first subset of longer interconnect lines such that a space occupied by the shorter interconnect line is not filled by another interconnect line or component when the shorter interconnect line reaches the end of its generally parallel run length, and selectively adjusting the cross sectional area of each member of the set of generally parallel and physically proximate interconnect lines to reduce an inherent interconnect line resistance.

A further method of adjusting an integrated circuit for a reduced conductor capacitance comprises forming a set of conductors of differing lengths implemented in close physical proximity and running generally in parallel to each other, with each conductor having a first capacitance, $C_B$, due to a bulk substrate capacitance and a second capacitance, $C_L$, due to conductor to conductor capacitance effects, routing a subset of generally longer than average conductors of the set of conductors, and reducing the second capacitance, $C_L$, due to conductor to conductor capacitance effects by routing a subset of generally shorter than average conductors of the set of conductors, such that in a plan view each member of the subset of shorter conductors is routed beside a member of the subset of longer conductors such that a space occupied by the shorter conductor is left open when the shorter conductor reaches the end of its generally parallel run length, providing a larger lateral separation.

An additional method of adjusting an integrated circuit for a reduced interconnect line RC time constant comprises forming a set of interconnect lines of differing lengths implemented in close physical proximity and running generally in parallel to each other with each interconnect line having a line resistance, $R_L$, a first capacitance, $C_B$, due to a bulk substrate capacitance, and a second capacitance, $C_L$, due to interconnect line to interconnect line capacitance effects, such that the interconnect line has a RC time constant of $R_L(C_B+C_L)$, routing a subset of generally longer than average interconnect lines of the set of interconnect lines, and reducing the second capacitance, $C_L$, due to interconnect line to interconnect line capacitance effects by routing a subset of generally shorter than average interconnect lines of the set of interconnect lines, wherein an average RC time constant of the set of interconnect lines is reduced by routing each member of the subset of shorter interconnect lines beside a member of the subset of longer interconnect lines such that a space occupied by the shorter interconnect line is left unfilled when the shorter interconnect line reaches the end of its generally parallel run length.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The resistance of a given interconnect line in an integrated circuit is a product of its cross sectional area, resistivity of the material comprising the interconnect line, and the length of the interconnect. The longer an interconnect line, the higher its inherent resistance for a given cross sectional area and material. The larger the cross sectional area, the lower the resistance of the interconnect line for a given length and material. However, increasing the cross sectional area of an interconnect line also has the effect of increasing its inherent capacitance with other components, which can be an undesired result.

In general, there are two sources of capacitance loading for an interconnect line in an integrated circuit, capacitance to the bulk silicon of the integrated circuit, and capacitance to other interconnect lines physically close by. The capacitance of an interconnect line to the bulk silicon of an integrated circuit can be described as a function of permittivity, line width, line length, and the thickness of the oxide insulator layer the interconnect line is placed on. Line-to-line capacitance is an effect that increases with decreasing feature size and line spacing. Line-to-line capacitance is generally a product of line height, line-to-line spacing, permittivity, and the length of the space that the interconnect line is run in close proximity to another line. Line-to-line capacitance is cumulative and has with modern reduced feature size integrated circuits increased to become a non-trivial effect and to be considered with the capacitive effect of the bulk silicon on an interconnect line.

The RC time constant of a given interconnect line that effects the interconnect line's signal delay properties is a product of the inherent line resistance, R, and any inherent line capacitance, C, that is due to both the bulk silicon effects and the line-to-line capacitance. These undesired input RC time constants add to the propagation delay of signals through the circuit at a given signal voltage level, and can cause problems with setup and hold timing requirements for the signal.

Figure 1:
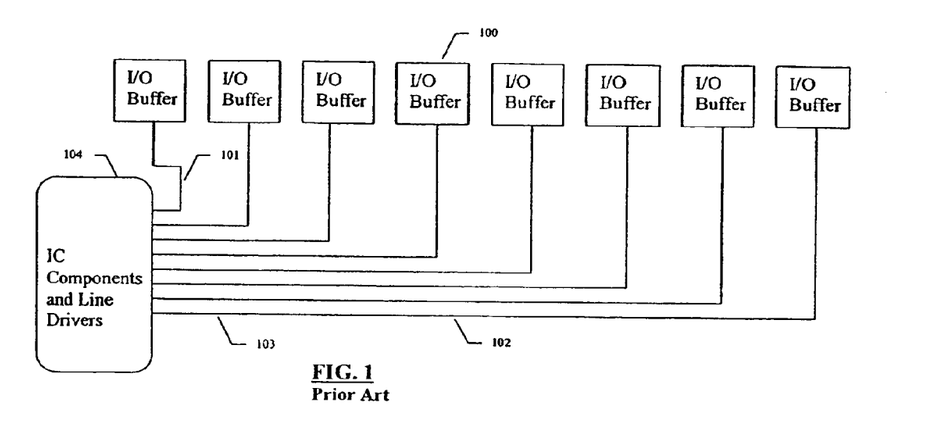
FIG. 1 is a diagram of a prior art integrated circuit, showing high speed interconnect lines, output pads, and an output buffer stage.

FIG. 1 illustrates a simplified example of an integrated circuit of the prior art wherein a series of I/O buffers 100 are coupled to an active integrated circuit 104 with a series of high speed interconnect lines 102. As shown in FIG. 1, the interconnect lines 102 have long segments that parallel in close physical proximity other interconnect lines of the circuit, giving a high line-to-line capacitance component to the inherent line capacitances when the circuit is implemented in a modem reduced feature size integrated circuit. As shown in FIG. 1, the interconnect lines are also of varying lengths and have varying sections where they run parallel to each other. The interconnect lines are generally physically placed on the integrated circuit in order of increasing length, short 101 to long 103, allowing the shorter run interconnect lines to route to their respective destinations before the next longer length interconnect line routes to its destination. This leaves the interconnect lines, which have a shorter length with a smaller line resistance and with smaller capacitance. This capacitance is smaller for both line-to-line capacitance effects and bulk capacitance effects, than that of the longer length interconnect lines. Combined with the larger inherent resistance of the longer interconnect lines, which is larger than that of the shorter interconnect lines, the individual interconnect line RC time constants will vary within the high speed interconnect lines 102 of FIG. 1, with the long run lines having a larger RC time constant than the shorter run interconnects.

Figure 2:
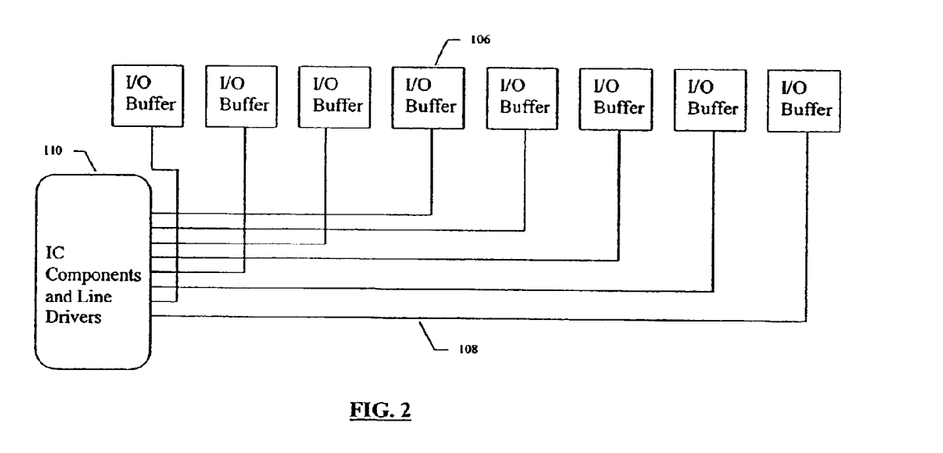
FIG. 2 is a diagram of an integrated circuit with an embodiment of the present invention, showing high speed interconnect lines, output pads, and an output buffer stage.

FIG. 2 illustrates a simplified example of an integrated circuit with an embodiment of the present invention. In the circuit of FIG. 2, a series of I/O buffers 106 are coupled to an active integrated circuit 110 with a series of high speed interconnect lines 108. As in FIG. 1, the interconnect lines 108 of FIG. 2 have long segments that run in parallel to other interconnect lines of the circuit. However, in the circuit of FIG. 2, the short run lines are placed in between the longer run lines in an alternating short-long-short-long pattern. As the short run lines reach the limit of their run length and fall off to route to their individual destination I/O buffer 106, spacing opens up along side the companion longer run interconnect lines. Because of this, there are not the same large sections where the interconnect lines 108 run in close proximity to each other, as in the integrated circuit of FIG. 1. Therefore, the circuit of FIG. 2 exhibits a smaller median line-to-line capacitance and RC time constant for a set of interconnect lines than that of FIG. 1. The interconnect line RC time constants in the circuit of FIG. 2, are smaller, on average, than a circuit of the prior art, and lead to circuit less signal propagation delay and less timing problems.

Figure 3:
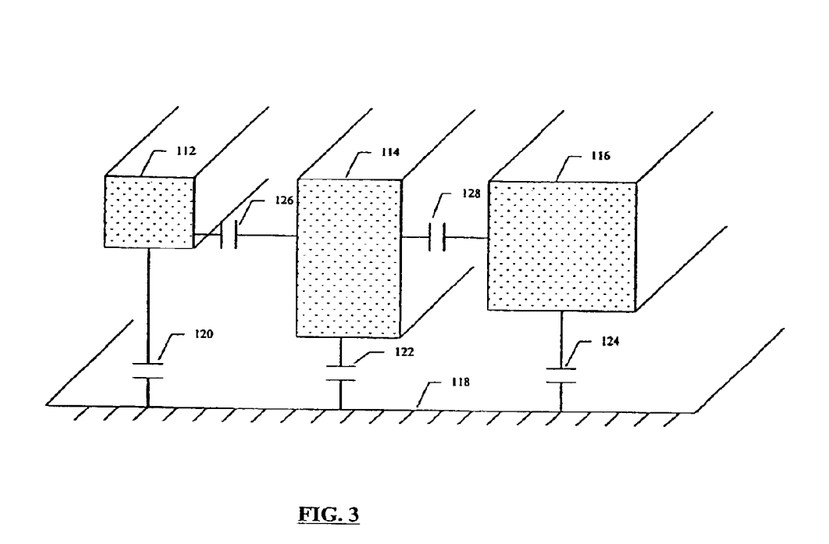
FIG. 3 is a cross section diagram of an integrated circuit with an embodiment of the present invention, showing variable sized cross section interconnects.

FIG. 3 is an illustration of a series of interconnect lines (112, 114, and 116) of an integrated circuit composed of a similar conducting material, typically metal or polysilicon, over a bulk silicon substrate 118. Also shown in FIG. 3 are schematic representations of sources of interconnect line capacitances; line to bulk capacitance (120, 122, and 124) and line-to-line capacitance (126 and 128).

The interconnects (112, 114, and 116) are of differing heights and widths, and therefore are of differing cross sectional area. As stated above, the resistance of an interconnect is a product of its cross sectional area, the resistivity of the material comprising the interconnect line, and the line length. Therefore, the differing cross sectional area of each interconnect line produces a differing interconnect line resistance for a given length. Generally though, the larger the cross sectional area of an interconnect, the lower the line resistance.

Unfortunately, increasing the area of an interconnect will also have the effect of increasing the line capacitance to both the bulk silicon substrate and the line-to-line capacitance. Thus, increasing the cross sectional area of an interconnect line to reduce the line resistance and therefore the RC time constant of the line will meet a point of diminishing returns, where the increased line capacitance will cancel out any reduction in the line resistance in its effect on the interconnect line RC time constant. However, if a balance in this resistance and capacitance is sought, the effect can be used to reduce the overall RC time constant to a minimum for a given interconnect line.

Figure 4A:
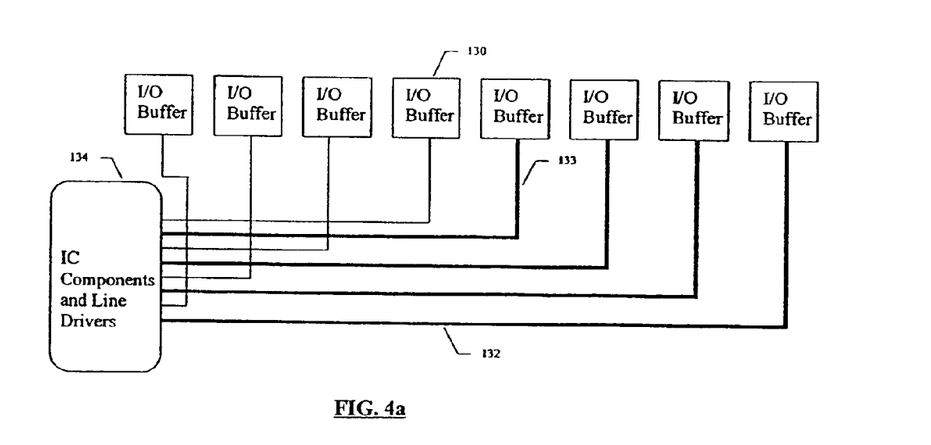
FIGS. 4a and 4b are diagrams of additional integrated circuits with an embodiment of the present invention, showing high speed interconnect lines, output pads, and an output buffer stage.
Figure 4B:
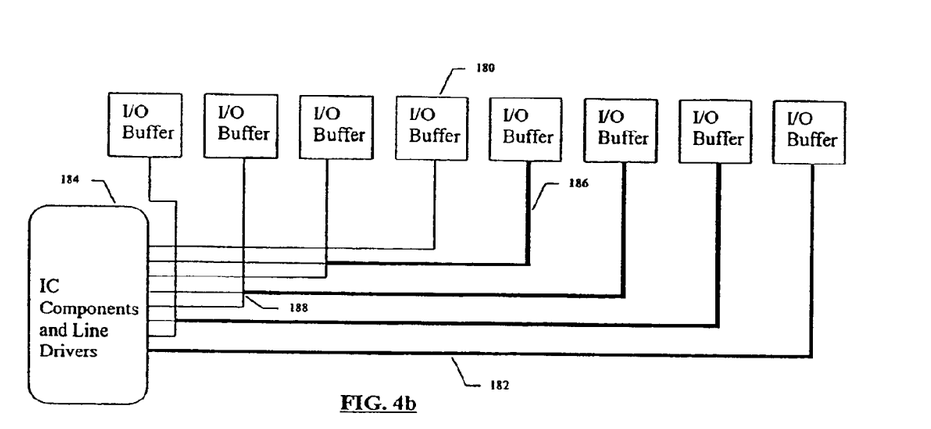

The ability to change the RC time constant of a given interconnect line by adjusting its cross sectional area can also be combined with another embodiment of the present invention as shown in the circuits of FIGS. 4a and 4b.

In FIG. 4a, a circuit of high speed interconnects is shown, such as in the circuit of FIG. 2. In the circuit of FIG. 4a, a series of I/O buffers 130 are coupled to an active integrated circuit 134 with a series of high speed interconnect lines 132. The interconnect lines 132 of FIG. 4a have long segments that parallel the other interconnect lines of the circuit. As in the circuit of FIG. 2, the shorter lines are alternated between the longer lines. As the short lines reach the limit of their parallel run length and fall off to route to their individual destination I/O buffer 130, spacing opens up along side the companion longer interconnect lines, reducing the line-to-line capacitance effects on the long run lines. In addition, in the circuit of FIG. 4a, the longer run interconnect lines have a larger cross sectional area than the shorter run lines and thus have a lower resistance value per unit length. The longer run interconnect lines are shown heavier 133 in FIG. 4a to illustrate this.

In FIG. 4b, another circuit of high speed interconnects is shown, such as in the circuit of FIG. 2. In the circuit of FIG. 4b, a series of I/O buffers 180 are coupled to an active integrated circuit 184 with a series of high speed interconnect lines 182. The interconnect lines 182 of FIG. 4b have long segments that parallel the other interconnect lines of the circuit. As in the circuit of FIG. 2, the shorter lines are alternated between the longer lines. As the short lines reach the limit of their parallel run length and fall off to route to their individual destination I/O buffer 180, spacing opens up along side the companion longer interconnect lines reducing the line-to-line capacitance effects on the long run lines. In addition, as in the circuit of FIG. 4a, in the circuit of FIG. 4b the longer run interconnect lines have sections of a larger cross sectional area than that of the shorter run lines and thus have a lower resistance value per unit length for those sections. The sections of the longer run interconnect lines are shown heavier 186 in FIG. 4b to illustrate this. In the circuit of FIG. 4b the longer run interconnect lines initially have the same cross sectional area as the short run interconnect lines and flare out 188 to a larger cross sectional area after the short run lines fall off to take advantage of the increased line spacing. Therefore, the longer run interconnects of the circuit of FIG. 4b allow a lower line resistance to be achieved over an interconnect line of similar length. At the same time the longer run interconnects of FIG. 4b avoid an increase in line-to-line capacitance effects due to what would be a closer line spacing because of larger interconnect cross sectional area in the sections where they run in close parallel with the short run lines.

In implementation of the circuits of FIGS. 4a and 4b, a balance should be sought between any gain in capacitance from line cross sectional area, reduction in line-to-line capacitance due to routing, and reduction in line resistance to achieve an optimal interconnect line RC time constant. This time constant can be optimized for a single line of a group of interconnects, or to optimize the average RC of the group of interconnect lines it is utilized on. It is noted that the circuits of FIGS. 4a and 4b are for illustrative purposes and that other approaches for optimizing the RC time constants of a single line or a group of lines with the above techniques will be apparent to those skilled in the art.

Figure 5:
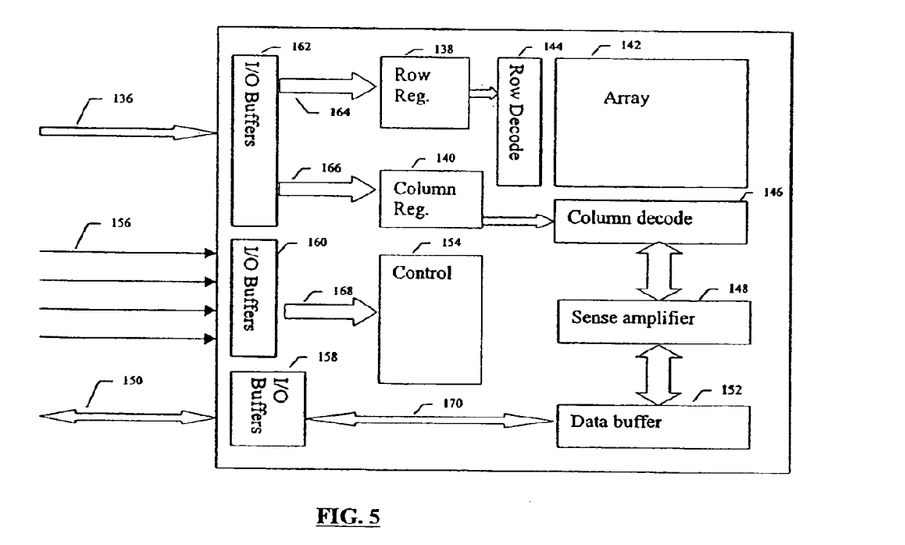
FIG. 5 is a diagram of a memory device incorporating an embodiment of the present invention.

FIG. 5 shows an illustration of a non-volatile memory device of an embodiment of the present invention. It is noted that the memory device of FIG. 5 is only shown as an example, and embodiments of the present invention can include multiple types of other integrated circuits (i.e., a processor, a volatile memory device, an ASIC, etc.). Memory devices are well known in the prior art, and the following description is intended only to be an overview of their operation and provide an example of their operation with an embodiment of the present invention.

The non-volatile memory device of FIG. 5 contains an array of nonvolatile floating gate memory cells arranged in columns coupled to bit lines as its main memory structure. In the memory device of FIG. 5, address values for the memory are received on the external address bus connections 136. The received address values are stored internal to the memory device and utilized to select the memory cells in the array to read and write data to. In the case of the memory device of FIG. 5, the internal address register is shown split with both a row address register 138 and column address register 140. The address values held in the row address register 138 and column address register 140 select a data word from the non-volatile memory cell array 142 through the coupled row decode 144 and column decode 146 circuits. The selected data word is read by the coupled sense amplifier circuit 148. Data values for the memory device of FIG. 5 are received and transmitted on the bi-directional data word interface 150. Internal to the memory device, data to be written to or from the memory array 142 is held in the Data buffer 152. Control of the memory device of FIG. 5 for both read operations and write operations is actuated by the internal control circuit 154. The control circuit 154 operates in response external control signals received on control signal external interface connections 156 and to internal events.

As shown in FIG. 5 all external signal connections to the memory device are coupled to internal I/O buffers on the internal integrated circuit chip (158, 160, and 162). I/O buffers are shown for each of the major interfaces, address I/O buffers 162, data I/O buffers 158, and control signal I/O buffers 160. Interconnect lines (164, 166, 168, and 170) are embodiments of the present invention and couple the I/O buffers (158, 160, and 162) to their corresponding active component input circuits that accept the incoming signals. These interconnect circuits will have lower RC time constants for the interconnect circuits and resulting propagation delays for better high speed and synchronous performance. Additionally, the grouped high speed lines in the memory device, the address interface 136, and the data interface 150, can be selectively adjusted to closely match each other in resistance, or capacitance. The RC time constant of an individual interconnect line in a group of high speed lines, for example, a control line, may be adjusted to optimize it for a given timing requirement. Alternatively, the overall RC time constant of the interconnect lines can be adjusted to make the RC time constant/propagation delay of the grouped high speed lines as minimal and as similar as possible for better high speed or synchronous operation.

CONCLUSION

A high speed interconnect line group for an integrated circuit is described, having an improved line-to-line capacitance and overall RC time constant. The high speed interconnect line group incorporates a series of interconnect lines wherein shorter run lines are routed between longer run interconnect lines. As the short run interconnect lines reach their destination and fall away they open up the line spacing on the remaining interconnect lines and improve the line-to-line capacitance that dominates capacitive effects in modern reduced feature size integrated circuits. Additionally, the cross sectional area of the interconnect lines can be increased to lower the line resistance of longer run lines and compensate for the line capacitance without critically increasing the line-to-line capacitance of these lines and adversely affecting the overall line RC time constant. The described invention allows line capacitances, resistances, and RC time constants to be optimized for a single line of a group or for the entire group of interconnect lines, providing a low average value or a uniform value across all lines for uniform signal propagation delay across all of the optimized group.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of adjusting an integrated circuit for a reduced conductor capacitance, comprising:
   routing a first subset of generally longer conductors of a set of generally parallel and physically proximate conductors; and
   selectively routing a second subset of generally shorter conductors of the set of generally parallel and physically proximate conductors to reduce conductor to conductor capacitance,
   such hat in a plan view each member of the second subset of generally shorter conductors is routed beside a member of the first subset of longer conductors such that a space occupied by the shorter conductor is not filled by another conductor or component for a remaining portion of the generally parallel run length of the longer conductor when the shorter conductor reaches the end of its generally parallel run length, providing increased lateral separation.

2. The method of claim 1, further comprising coupling the set of conductors to at least one circuit comprised of active components.

3. The method of claim 1, further comprising coupling the set of conductors to at least one I/O buffer circuit.

4. The method of claim 1, further comprising coupling the set of conductors to receive a set of data signals.

5. The method of claim 1, further comprising coupling the set of conductors to receive a set of address signals.

6. A method of adjusting an integrated circuit for a reduced conductor capacitance, comprising:
routing a first subset of generally longer conductors of a set of generally parallel and physically proximate conductors;
selectively routing a second subset of generally shorter conductors of the set of generally parallel and physically proximate conductors to reduce conductor to conductor capacitance,
such that in a plan view each member of the second subset of generally shorter conductors is routed beside a member of the first subset of longer conductors such that a space occupied by the shorter conductor is not filled by another conductor or component when the shorter conductor reaches the end of its generally parallel run length, providing increased lateral separation; and
coupling the set of conductors to receive a set of control signals.

7. The method of claim 1, wherein the integrated circuit is a memory device.

8. The method of claim 7, wherein the memory device is a non-volatile memory device.

9. The method of claim 1, further comprising forming the set of conductors of metal.

10. The method of claim 1, further comprising forming the set of conductors of polysilicon.

11. The method of claim 1, further comprising coupling each member of the set of conductors to at least one of a set of distributed active circuits.

12. A method of adjusting an integrated circuit for a reduced interconnect line RC time constant, comprising:
routing a first subset of generally longer interconnect lines of a set of generally parallel and physically proximate interconnect lines;
selectively routing a second subset of generally shorter interconnect lines of the set of generally parallel and physically proximate interconnect lines to reduce interconnect line to interconnect line capacitance,
wherein each member of the second subset of generally shorter interconnect lines is routed beside a member of the first subset of longer interconnect lines such that a space occupied by the shorter interconnect line is not filled by another interconnect line or component for a remaining portion of the generally parallel run length of the longer conductor when the shorter interconnect line reaches the end of its generally parallel run length; and
selectively adjusting the cross sectional area of each member of the set of generally parallel and physically proximate interconnect lines to reduce an inherent interconnect line resistance.

13. The method of claim 12, further comprising coupling the set of interconnect lines to at least one circuit comprised of active components.

14. The method of claim 12, further comprising coupling the set of interconnect lines to at least one I/O buffer circuit.

15. The method of claim 12, further comprising coupling the set of interconnect lines to receive a set of data signals.

16. The method of claim 12, further comprising coupling the set of interconnect lines to receive a set of address signals.

17. A method of adjusting an integrated circuit for a reduced interconnect line RC time constant, comprising:
routing a first subset of generally longer interconnect lines of a set of generally parallel and physically proximate interconnect lines;
selectively routing a second subset of generally shorter interconnect lines of the set of generally parallel and physically proximate interconnect lines to reduce interconnect line to interconnect line capacitance,
wherein each member of the second subset of generally shorter interconnect lines is routed beside a member of the first subset of longer interconnect lines such that a space occupied by the shorter interconnect line is not filled by another interconnect line or component when the shorter interconnect line reaches the end of its generally parallel run length;
selectively adjusting the cross sectional area of each member of the set of generally parallel and physically proximate interconnect lines to reduce an inherent interconnect line resistance; and
coupling the set of interconnect lines to receive a set of control signals.

18. The method of claim 12, wherein the integrated circuit is a memory device.

19. The method of claim 18, wherein the memory device is a non-volatile memory device.

20. The method of claim 12, further comprising forming the set of interconnect lines of metal or polysilicon.

21. The method of claim 12, further comprising coupling each member of the set of interconnect lines to at least one of a set of distributed active circuits.

22. A method of adjusting an integrated circuit for a reduced interconnect line RC time constant, comprising:
routing a first subset of generally longer interconnect lines of a set of generally parallel and physically proximate interconnect lines;
selectively routing a second subset of generally shorter interconnect lines of the set of generally parallel and physically proximate interconnect lines to reduce interconnect line to interconnect line capacitance,
wherein each member of the second subset of generally shorter interconnect lines is routed beside a member of the first subset of longer interconnect lines such that a space occupied by the shorter interconnect line is not filled by another interconnect line or component when the shorter interconnect line reaches the end of its generally parallel run length;
selectively adjusting the cross sectional area of each member of the set of generally parallel and physically proximate interconnect lines to reduce an inherent interconnect line resistance; and
wherein selectively adjusting the cross sectional area of each member of the set of generally parallel and physically proximate interconnect lines to reduce an inherent interconnect line resistance comprises, adjusting only the cross sectional area of members of the first subset of generally longer interconnect lines.

23. A method of adjusting an integrated circuit for a reduced interconnect line RC time constant, comprising:
routing a first subset of generally longer interconnect lines of a set of generally parallel and physically proximate interconnect lines;
selectively routing a second subset of generally shorter interconnect lines of the set of generally parallel and physically proximate interconnect lines to reduce interconnect line to interconnect line capacitance,
wherein each member of the second subset of generally shorter interconnect lines is routed beside a member of the first subset of longer interconnect lines such that a space occupied by the shorter interconnect line is not filled by another interconnect line or component when the shorter interconnect line reaches the end of its generally parallel run length;

selectively adjusting the cross sectional area of each member of the set of generally parallel and physically proximate interconnect lines to reduce an inherent interconnect line resistance; and wherein selectively adjusting the cross sectional area of each member of the set of generally parallel and physically proximate interconnect lines to reduce an inherent interconnect line resistance comprises, adjusting only the cross sectional area of members of the first subset of generally longer interconnect lines, such that the cross sectional area of each member of the subset of generally longer interconnect lines is increased after the shorter interconnect lines routed beside them reach the end of their generally parallel run length.

24. A method of adjusting an integrated circuit for a reduced conductor capacitance, comprising:

forming a set of conductors of differing lengths implemented in close physical proximity and running generally in parallel to each other, with each conductor having a first capacitance, $C_B$, due to a bulk substrate capacitance and a second capacitance, $C_L$, due to conductor to conductor capacitance effects;

routing a subset of generally longer than average conductors of the set of conductors; and reducing the second capacitance, $C_L$, due to conductor to conductor capacitance effects by routing a subset of generally shorter than average conductors of the set of conductors, such that in a plan view each member of the subset of the generally shorter conductors is routed beside a member of the subset of the generally longer conductors such that a space occupied by the generally shorter conductor is left open when the generally shorter conductor reaches the end of its generally parallel run length, providing a larger lateral separation.

25. The method of claim 24, wherein the integrated circuit is a memory device.

26. The method of claim 25, wherein the memory device is a non-volatile memory device.

27. The method of claim 24, further comprising forming the set of conductors of metal or polysilicon.

28. A method of adjusting an integrated circuit for a reduced interconnect line RC time constant, comprising:

forming a set of interconnect lines of differing lengths implemented in close physical proximity and running generally in parallel to each other with each interconnect line having a line resistance, $R_L$, a first capacitance, $C_B$, due to a bulk substrate capacitance, and a second capacitance, $C_L$, due to interconnect line to interconnect line capacitance effects, such that the interconnect line has a RC time constant of $R_L$ ($C_B+C_L$); routing a subset of generally longer than average interconnect lines of the set of interconnect lines; and reducing the second capacitance, $C_L$, due to interconnect line to interconnect line capacitance effects by routing a subset of generally shorter than average interconnect lines of the set of interconnect lines, wherein an average RC time constant of the set of interconnect lines is reduced by routing each member of the subset of shorter interconnect lines beside a member of the subset of longer interconnect lines such that a space occupied by the shorter interconnect line is left unfilled when the shorter interconnect line reaches the end of its generally parallel run length.

29. The method of claim 28, wherein the integrated circuit is a memory device.

30. The method of claim 29, wherein the memory device is a non-volatile memory device.

31. The method of claim 28, further comprising forming the set of interconnect lines of metal or polysilicon.

32. The method of claim 28, further comprising reducing a median interconnect line RC time constant by selectively adjusting the line resistance $R_L$ by varying the cross sectional area of members of the set of interconnect lines.

33. The method of claim 28, further comprising selectively adjusting the line resistance $R_L$ by varying the cross sectional area of members of the subset generally longer than average interconnect lines.

34. The method of claim 33, further comprising balancing the reduction in the line resistance $R_L$ with the increase in $C_L$ for increasing the interconnect line cross sectional area.

35. The method of claim 33, further comprising balancing the reduction in the line resistance $R_L$ with the increase in $C_L$ and $C_B$ for increasing the interconnect line cross sectional area so that the RC time constant of $R_L$ ($C_B+C_L$) proximates a minimum.

36. The method of claim 28, further comprising selectively adjusting the line resistance $R_L$ by varying the cross sectional area of members of the subset generally longer than average interconnect lines, such that the cross sectional area of each member of the subset of generally longer interconnect lines is increased after the shorter interconnect lines routed beside them reach the end of their generally parallel run length.

37. A method of adjusting the interconnect line capacitance of a memory device comprising:

forming an address interface coupled to a first I/O buffer circuit;

forming a first interconnect circuit coupled to the first I/O buffer circuit;

forming a data interface coupled to a second I/O buffer circuit;

forming a second interconnect circuit coupled to the second I/O buffer circuit;

forming a control interface coupled to a third I/O buffer circuit;

forming a third interconnect circuit coupled to the third I/O buffer circuit; and routing each of the first, second and third interconnect circuits such that, for each of the first, second and third interconnect circuits, a set of interconnect lines of differing lengths implemented in close physical proximity and running generally in parallel to each other in a plan view, wherein a subset of generally longer than average interconnect lines, and a subset of generally shorter than average interconnect lines, are routed such that each member of the subset of the generally shorter interconnect lines is routed beside a member of the subset of the generally longer interconnect lines such that a space occupied by the generally shorter interconnect line is not filled by another interconnect line or component when the generally shorter interconnect line reaches the end of its generally parallel run length.

38. The method of claim 37, wherein the memory device comprises non-volatile memory.

39. The method of claim 37, further comprising forming each set of interconnect lines of the first, second and third interconnect circuits of metal or polysilicon.

40. The method of claim 37, wherein routing each set of interconnect lines of the first, second and third interconnect circuits comprises placing each member of the subset of generally longer interconnect lines and subset of generally shorter interconnect lines to reduce the individual interconnect line capacitance due to interconnect line to interconnect line capacitance.

41. The method of claim 37, wherein routing each set of interconnect lines of the first, second and third interconnect circuits comprises placing each member of the subset of generally longer interconnect lines and subset of generally shorter interconnect lines to reduce the average RC time constant of the first, second, and third sets of interconnect lines.

42. The method of claim 37, wherein routing each set of interconnect lines of the first, second and third interconnect circuits comprises placing each member of the subset of generally longer interconnect lines and subset of generally shorter interconnect lines to reduce the average RC time constant of the first, second, and third sets of interconnect lines by selectively adjusting the individual interconnect line capacitance due to interconnect line-to-line capacitance effects and selectively adjusting the inherent line resistance due to cross sectional area of the subsets of generally shorter interconnect lines.

43. The method of claim 37, wherein routing each set of interconnect lines of the first, second and third interconnect circuits comprises placing each member of the subset or generally longer interconnect lines and subset of generally shorter interconnect lines so as to reduce the average RC time constant of the first, second, and third interconnect circuits sets of interconnect lines by selectively adjusting the individual interconnect line capacitance due to interconnect line-to-line to-line capacitance and selectively adjusting the inherent line resistance due to cross sectional area of the subsets of generally longer interconnect lines.

44. The method of claim 37, wherein routing each set of interconnect lines of the first, second and third interconnect circuits comprises placing each member of the subset of generally longer interconnect lines and subset of generally shorter interconnect lines so as to reduce the average RC time constant of the first, second, and third sets of interconnect lines by selectively adjusting the individual interconnect line capacitance due to interconnect line-to-line capacitance and selectively adjusting the inherent line resistance due to cross sectional area of the subsets of generally longer interconnect lines, such that the cross sectional area of each member of the subsets of generally longer interconnect lines is increased after the shorter interconnect lines routed beside them reach the end of their generally parallel run length.

* * * * *

UNITED STATES PATENT AND TRADEMARK OFFICE
CERTIFICATE OF CORRECTION

PATENT NO. : 7,028,282 B2  Page 1 of 1
APPLICATION NO. : 10/368,992
DATED : April 11, 2006
INVENTOR(S) : Frankie Fariborz Roohparvar It is certified that error appears in the above-identified patent and that said Letters Patent is hereby corrected as shown below:

Column 1,
Line 17, replace "modem", with --modern--

Column 5,
Line 18, replace "modem", with --modern--

Column 8,
Line 49, replace "hat", with --that--

Column 13
Line 24, replace "or", with --of--

Signed and Sealed this

Fifteenth Day of August, 2006

JON W. DUDAS
*Director of the United States Patent and Trademark Office*